United States Patent
Stollsteimer et al.

[11] Patent Number: 6,140,916
[45] Date of Patent: *Oct. 31, 2000

[54] APPARATUS AND METHOD FOR POSITION ENCODING

[75] Inventors: Dale Otto Stollsteimer, West Bloomfield; Raymond Scott Alvey, Utica; Patrick William Gibson, Northville; Todd Alan Snover, Oak Park, all of Mich.

[73] Assignee: Ford Global Technologies, Inc., Dearborn, Mich.

[ * ] Notice: This patent issued on a continued prosecution application filed under 37 CFR 1.53(d), and is subject to the twenty year patent term provisions of 35 U.S.C. 154(a)(2).

[21] Appl. No.: 08/192,520

[22] Filed: Feb. 7, 1994

[51] Int. Cl.$^7$ .............................. B60Q 1/00; F16H 59/00

[52] U.S. Cl. ........................... 340/456; 341/35; 341/192; 200/61.28; 200/61.37; 200/61.85; 74/337.5; 476/12

[58] Field of Search .................... 340/456; 341/35, 341/183, 29, 178, 192; 200/273, 274, 61, 28, 61.37, 61.39, 61.46, 61.88; 477/5; 476/12; 74/337.5

[56] References Cited

U.S. PATENT DOCUMENTS

| | | | |
|---|---|---|---|
| 4,664,217 | 5/1987 | Welch et al. | 180/247 |
| 5,049,879 | 9/1991 | Symonds | 341/13 |
| 5,086,221 | 2/1992 | Ishihara et al. | 341/13 |
| 5,325,083 | 6/1994 | Nassar et al. | 340/456 |

FOREIGN PATENT DOCUMENTS

| | | |
|---|---|---|
| 809343 | 2/1959 | United Kingdom . |
| 809679 | 3/1959 | United Kingdom . |
| 810333 | 3/1959 | United Kingdom . |
| 1148728 | 4/1969 | United Kingdom . |
| 2 143 390 | 2/1985 | United Kingdom . |

*Primary Examiner*—Donnie L. Crosland
*Attorney, Agent, or Firm*—Mark S. Sparschu

[57] ABSTRACT

A transfer case motor controls the rotation of a cam. The cam actuates various gear states of a transfer case of a four-wheel-drive vehicle. A contact plate rotates with the cam and encodes the position of the cam as a four-bit binary code. The code is such that when the cam travels between any two gear states, one bit of the four-bit code stays constant from the initial gear state until the final gear state is reached. The single bit can thus be observed to determine that the final gear state has been reached. The encoding scheme is also such that the bit which stays constant always assumes the same state.

7 Claims, 1 Drawing Sheet

APPARATUS AND METHOD FOR POSITION ENCODING

BACKGROUND OF THE INVENTION

1. Field of the Invention

The present invention relates to a method and apparatus for encoding the position of a component.

2. Description of the Related Art

Frequently when a controller electrically controls the position of a mechanical component, it is desirable to have feedback indicating the position of the mechanical component. Such feedback provides the controller with an indication of the present position of the mechanical component being controlled. One application for such position feedback is in a transfer case motor for a four-wheel-drive vehicle. Such a motor drives a component, typically a cam, typically in a rotary motion. The motion of the cam facilitates shifting of the transfer case into various gear states such as "two-wheel-drive high", "four-wheel-drive low", "four-wheel-drive high", and "neutral".

A typical way of encoding the position of a mechanical component is with a "contact plate". Such a contact plate is coupled to the mechanical component whose position is being controlled. As the component moves, the contact plate moves as well. The contact plate typically has a number of electrically conductive areas disposed such that the contact plate produces a binary code which represents the position of the mechanical component. The binary code is sent from the contact plate via a series of conductive brushes positioned in contact with the contact plate. Each brush is typically connected to electronic circuitry designed to read the signal on the brush. The signal on each brush represents a binary digit (a "bit"). The bits represented by the signals on the brushes form the binary codes which indicate the position of the mechanical component being controlled.

It is desirable for a position encoding scheme to have a number of features. First, when the mechanical component being controlled travels from one "particularly significant" position to another, a single one of the circuits can be monitored for indication that the mechanical component has reached its destination position. That allows simplified detecting of the movement of the mechanical component, as only one circuit needs to be monitored by the device which is reading the signals from the contact plate. "Particularly significant" positions of a typical transfer case motor are the gear states mentioned above. Other positions of a transfer case motor typically encoded by a contact plate are intermediate positions between those gear states.

A second desirable feature of an encoding scheme is that the switching of that single circuit just mentioned always be in the same direction (that is, low voltage to high voltage or high voltage to low voltage). That helps to simplify the device which is reading the signals generated by the encoding scheme.

SUMMARY OF THE INVENTION

The present invention provides a position-encoding system. The system includes a device adapted to shift gears of a motor vehicle. The system further comprises an encoder coupled to the device to indicate the current gear. The encoder further includes a substrate and conductive material disposed on the substrate. The conductive material is disposed such that the conductive material forms patterns composed of a series of states, each state composed of either a presence or an absence of conductive material. The encoder has a plurality of regions characterized by the patterns, some of the patterns indicating gears and some of the patterns indicating intermediate positions between gears. Upon movement from any first gear to any second gear, one state remains constant from the first gear and changes only upon arrival at the second gear.

The present invention provides the desirable feature of allowing the assignment of "particularly significant" positions of a mechanical component to codes such that when the component travels from one such position to another, a single state or bit of the codes can be observed to determine that the final position has been reached. Further, the invention provides the feature of allowing the single state or bit being observed to be assigned the same value for all combinations of "particularly significant" positions.

DETAILED DESCRIPTION OF THE PREFERRED EMBODIMENT

Figure 1:
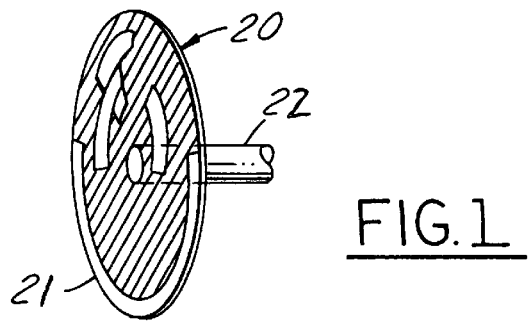
FIG. 1 is a perspective view of the contact plate of the present invention.
Figure 2:
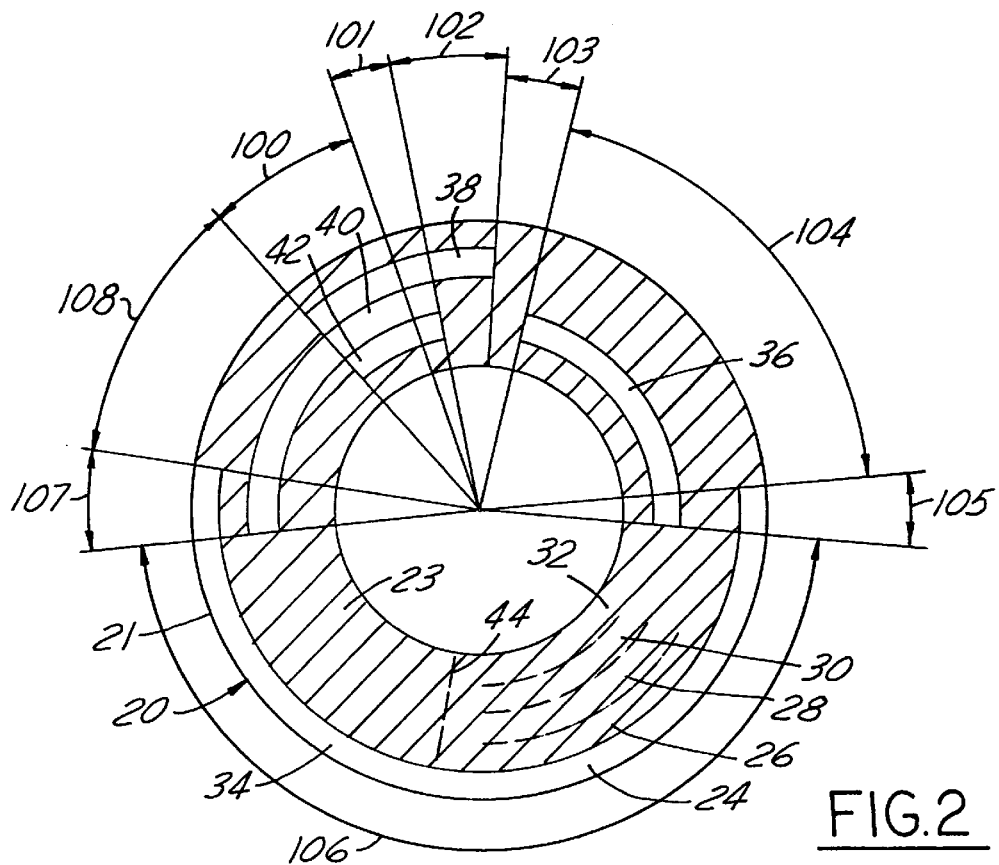
FIG. 2 is a front view of disk portion 21 of the contact plate of FIG. 1.

Referring to FIGS. 1 and 2, a contact plate 20 is illustrated. Contact plate 20 comprises a disk portion 21 and a shaft 22. Contact plate 20 is intended to rotate about the axis of shaft 22.

Disk portion 21 comprises an electrically insulating substrate such as plastic or fiberglass. Disposed on the insulating substrate of disk portion 21 is conductive material 23 such as copper commonly used on circuit boards. In FIGS. 1 and 2 conductive material 23 is illustrated with hatched shading. Referring now to FIG. 2, the surface of disk portion 21 of contact plate 20 can be thought of to have five tracks or paths, labelled 24, 26, 28, 30, and 32. Within the paths various arcs are disposed without conducting material. In FIG. 2, those arcs are designated 34, 36, 38, 40, and 42. Arcs 34, 36, 38, 40, and 42 thus expose the electrically insulating substrate of disk portion 21 of contact plate 20.

Various rotational positions of contact plate 20 are thus identifiable by different sequences of presence and absence of conducting material 23 on the surface of disk portion 21. For example, a region 100 depicted in FIG. 2 is characterized by a presence of conducting material on path 24 and an absence of conducting material on paths 26, 28, and 30. As a further illustration, region 101 depicted in FIG. 2 is characterized by a presence of conducting material on path 24, an absence of conducting material on path 26, a presence of conducting material on path 28, and an absence of conducting material on path 30.

In the preferred embodiment of the present invention, contact plate 20 is installed in a transfer case motor of a four-wheel-drive motor vehicle. Such a transfer case motor rotates a cam which in turn causes a transfer case to shift among a number of gear states, including two-wheel-drive high, four-wheel-drive low, four-wheel-drive high, and neutral. Contact plate 20 is mechanically coupled within the transfer case motor so as to rotate about shaft 22 (FIG. 1) as the transfer case motor rotates the cam. Contact plate 20 can thus be used to encode the rotational position of the cam which causes the transfer case to shift among its various gear states.

Figure 3:
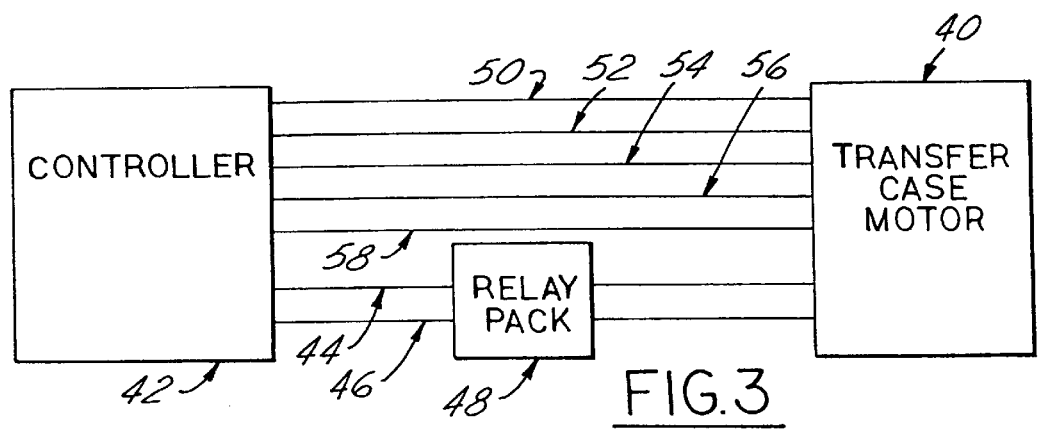
FIG. 3 is a block diagram of a system containing the contact plate of FIGS. 1 and 2.

A block diagram showing the electrical connections to contact plate 20 is shown in FIG. 3. As previously mentioned, contact plate 20 is located within transfer case motor 40 An electronic controller 42 has responsibility for controlling transfer case motor 40 Electronic controller 42 uses two circuits 44 and 46 to drive transfer case motor 40 in two rotational directions via a relay pack 48. Electronic controller 42 monitors the rotational position of contact plate 20 (and therefore also the rotational position of the cam rotated by transfer case motor 40) via four circuits 50, 52, 54, and 56. Within transfer case motor 40, circuits 50, 52, 54 and 56 are electrically connected to contact plate 20 (FIG. 2) by stationary conductive brushes positioned, for example, along line 44 (FIG. 2). Circuit 50 is connected via a brush to path 24; circuit 52 is connected to path 26; circuit 54 is connected to path 28; and circuit 56 is connected to path 30. Within electronic controller 42, circuits 50, 52, 54, and 56 are connected to electronic circuitry which can read the state of discrete electrical signals. Such circuitry is well-known to one skilled in the arts to which the present invention applies.

Continuing to refer to FIG. 3, circuit 58 also connects electronic controller 42 and transfer case motor 40. Within transfer case motor 40, circuit 58 is electrically connected to disk portion 21 of contact plate 20 (FIG. 2) via a conductive brush connected to path 32. Within electronic controller 42, circuit 58 is connected to either ground or to a constant reference voltage supply. When circuit 58 is so connected, all of the conductive material 23 is at that same potential (i.e., ground or the constant reference voltage), because all of the conductive material 23 of disk portion 21 is in electrical contact.

With circuits 50, 52, 54, 56, and 58 connected as just described, contact plate 20 can indicate to electronic controller 42 the rotational position of the cam rotated by transfer case motor 40 For example, when the conductive brushes are in region 100, a binary code of "1 0 0 0" is provided, wherein the first binary character is the state of circuit 50, the second binary character is the state of circuit 52, the third binary character is the state of circuit 54, and the fourth binary character is the state of circuit 56. It should be noted that the definition of the "1" state of the binary characters can refer to either the presence or absence of conductive material. In the present embodiment, "1" refers to the presence of conductive material. The entire list of regions of disk portion 21 of contact plate 20 and associated binary codes is detailed as follows:

TABLE 1

| Region | Code |
|---|---|
| 100 | 1 0 0 0 |
| 101 | 1 0 1 0 |
| 102 | 1 0 1 1 |
| 103 | 1 1 1 1 |
| 104 | 1 1 1 0 |
| 105 | 0 1 1 0 |
| 106 | 0 1 1 1 |
| 107 | 0 1 0 1 |
| 108 | 1 1 0 1 |

In the preferred embodiment of the present invention, the various regions of disk portion 21 of contact plate 20 refer to the following rotational positions of the cam rotated by transfer case motor 40 Region 100 refers to a mechanical stop at one end of rotational travel of the cam rotated by transfer case motor 40. Region 102 refers to gear state "two-wheel-drive high" of the transfer case, the gear state being actuated by the cam rotated by transfer case motor 40. Region 101 refers to an intermediate position of travel of the cam between region 100 and region 102. Region 105 refers to gear state "four-wheel-drive high" of the transfer case. (In an alternative embodiment, region 105 refers to gear state "Neutral" of the transfer case). Regions 103 and 104 refer to intermediate positions of travel of the cam between region 102 and region 105. Region 107 refers to gear state "four-wheel-drive low" of the transfer case. Region 106 refers to an intermediate region of travel of the cam between region 105 and region 107. Finally, region 108 refers to a mechanical stop at a second end of rotational travel of the cam rotated by transfer case motor 40. The regions of contact plate 40, associated codes and associated rotational positions of the cam rotated by transfer case motor 40 are therefore as follows:

TABLE 2

| Region | Code | Rotational Position |
|---|---|---|
| 100 | 1 0 0 0 | Mechanical stop |
| 101 | 1 0 1 0 | Intermediate position |
| 102 | 1 0 1 1 | "Two-wheel-drive high" gear state |
| 103 | 1 1 1 1 | Intermediate position |
| 104 | 1 1 1 0 | Intermediate position |
| 105 | 0 1 1 0 | "Four-wheel-drive high" gear state OR "Neutral" gear state |
| 106 | 0 1 1 1 | Intermediate position |
| 107 | 0 1 0 1 | "Four-wheel-drive low" gear state |
| 108 | 1 1 0 1 | Mechanical stop |

Two particular items regarding Table 2 should be noted. First, in moving from any of the gear states to any other, one of the four code bits remains constant from the initial gear state until the final gear state is reached. For example, in moving from "two-wheel-drive high" to "four-wheel-drive high", codes "1 0 1 1", "1 1 1 1", "1 1 1 0" and "0 1 1 0" are generated. The first bit of the codes is seen to be "1" from initiation of the movement until the final gear state is reached. As another example, a similar result (one bit held constant until the final gear state is reached) is seen to exist in moving from "four-wheel-drive low" to "two-wheel-drive high".

The second item of note regarding Table 2 is that the bit held constant during travel from any gear state to any other gear state is always held constant in the same value (here, the value of "1").

Various modifications and variations will no doubt occur to those skilled in the arts to which this invention pertains. Such variations which generally rely on the teachings through which this disclosure has advanced the art are properly considered within the scope of this invention.

What is claimed is:

1. A position-encoding system comprising:

a device adapted to shift gears of a motor vehicle; and an encoder coupled to said device to indicate the current gear, said encoder further comprising:

a substrate; and conductive material disposed on said substrate, such that said conductive material forms patterns composed of a series of states, each state having a value composed of either a presence or an absence of conductive material, wherein said encoder has a plurality of regions characterized by said patterns, some of said patterns indicating gears and some of said patterns indicating intermediate positions between gears, wherein upon movement from any and all first said gears to any and all second said gears, one said state remains constant from said first gear and changes only upon arrival at said second gear;

wherein all said conductive material which forms said patterns is electrically connected.

2. A position-encoding system as recited in claim 1, wherein every said state which remains constant until arrival at a said second gear remains constant with the same value.

3. A position-encoding system as recited in claim 1, wherein each said pattern comprises at least four bits.

4. A position-encoding system as recited in claim 3, wherein:

patterns "1011", "0110", and "0101" indicate gears; and

"1" refers to the presence of conductive material and "0" refers to the absence of conductive material.

5. A position-encoding system as recited in claim 4, wherein said encoder comprises the following patterns arranged in the following sequence:
1000
1010
1011
1111
1110
0110
0111
0101
1101.

6. A position-encoding system as recited in claim 3, wherein:

patterns "1011", "0110", and "0101" indicate gears; and

"0" refers to the presence of conductive material and "1" refers to the absence of conductive material.

7. A position-encoding system as recited in claim 6, wherein said encoder comprises the following patterns arranged in the following sequence:
1000
1010
1011
1111
1110
0110
0111
0101
1101.

* * * * *